(12) United States Patent
Chan et al.

(10) Patent No.: US 7,253,034 B2
(45) Date of Patent: Aug. 7, 2007

(54) DUAL SIMOX HYBRID ORIENTATION TECHNOLOGY (HOT) SUBSTRATES

(75) Inventors: Kevin K. Chan, Staten Island, NY (US); Joel P. de Souza, Putnam Valley, NY (US); Alexander Reznicek, Mount Kisco, NY (US); Devendra K. Sadana, Pleasantville, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 10/902,557

(22) Filed: Jul. 29, 2004

(65) Prior Publication Data

US 2006/0024931 A1 Feb. 2, 2006

(51) Int. Cl.
*H01L 21/70* (2006.01)
*H01L 21/762* (2006.01)

(52) U.S. Cl. .................. 438/149; 438/150; 438/154; 438/155

(58) Field of Classification Search ............... None
See application file for complete search history.

(56) References Cited

U.S. PATENT DOCUMENTS

| | | | | |
|---|---|---|---|---|
| 5,173,446 | A * | 12/1992 | Asakawa et al. | 438/412 |
| 5,610,083 | A * | 3/1997 | Chan et al. | 438/155 |
| 6,830,962 | B1 | 12/2004 | Guarini et al. | |
| 7,023,055 | B2 * | 4/2006 | Ieong et al. | 257/369 |
| 7,023,057 | B2 * | 4/2006 | Ieong et al. | 257/369 |
| 7,087,965 | B2 * | 8/2006 | Chan et al. | 257/347 |
| 7,138,683 | B2 | 11/2006 | Guarini et al. | |
| 2005/0093077 | A1 * | 5/2005 | Ieong et al. | 257/369 |
| 2005/0093104 | A1 * | 5/2005 | Ieong et al. | 257/627 |
| 2005/0116290 | A1 | 6/2005 | de Souza et al. | |
| 2005/0236687 | A1 * | 10/2005 | Chan et al. | 257/482 |
| 2005/0280121 | A1 * | 12/2005 | Doris et al. | 257/629 |
| 2006/0024931 | A1 * | 2/2006 | Chan et al. | 438/528 |

OTHER PUBLICATIONS

Yang, M. et al. "High Performance CMOS Fabricated on Hybrid Substrate With Different Crystal Orientations," IBM Semiconductor Research and Development Center.

* cited by examiner

*Primary Examiner*—David E. Graybill
(74) *Attorney, Agent, or Firm*—Scully, Scott, Murphy & Presser, P.C.; Robert M. Trepp, Esq.

(57) ABSTRACT

This invention provides a separation by implanted oxygen (SIMOX) method for forming planar hybrid orientation semiconductor-on-insulator (SOI) substrates having different crystal orientations, thereby making it possible for devices to be fabricated on crystal orientations providing optimal performance. The method includes the steps of selecting a substrate having a base semiconductor layer having a first crystallographic orientation separated by a thin insulating layer from a top semiconductor layer having a second crystallographic orientation; replacing the top semiconductor layer in selected regions with an epitaxially grown semiconductor having the first crystallographic orientation; then using an ion implantation and annealing method to (i) form a buried insulating region within the epitaxially grown semiconductor material, and (ii) thicken the insulating layer underlying the top semiconductor layer, thereby forming a hybrid orientation substrate in which the two semiconductor materials with different crystallographic orientations have substantially the same thickness and are both disposed on a common buried insulator layer. In a variation of this method, an ion implantation and annealing method is instead used to extend an auxiliary buried insulator layer (initially underlying the base semiconductor layer) upwards (i) into the epitaxially grown semiconductor, and (ii) up to the insulating layer underlying the top semiconductor layer.

37 Claims, 17 Drawing Sheets

DUAL SIMOX HYBRID ORIENTATION TECHNOLOGY (HOT) SUBSTRATES

RELATED APPLICATIONS

This application is related to co-pending and co-assigned U.S. patent application Ser. No. 10/250,241, filed Jun. 17, 2003 entitled "High-performance CMOS SOI devices on hybrid crystal-oriented substrates," co-pending and co-assigned U.S. patent application Ser. No. 10/634,446, filed Aug. 5, 2003 entitled "Self-aligned SOI with different crystal orientation using wafer bonding and SIMOX processes," and co-pending and co-assigned U.S. patent application Ser. No. 10/725,850, filed Dec. 2, 2003 entitled "Planar substrate with selected semiconductor crystal orientations formed by localized amorphization and recrystallization of stacked template layers." The entire content of each of the three applications mentioned above is incorporated by reference.

The '241 application describes an epitaxial growth method for making a planar hybrid orientation substrate which comprises one or more regions of a first single-crystal semiconductor disposed on bulk silicon, said first semiconductor having a first orientation; and one or more regions of a second single-crystal semiconductor disposed on a buried oxide (BOX) layer, said second semiconductor having a second orientation different from the first.

The '446 application expands upon the methods of the '241 application, providing additional steps for selectively forming a BOX layer under the one or more regions of second semiconductor by a SIMOX (separation by implanted oxygen) treatment applied through openings in a mask.

The '850 application describes an amorphization/templated recrystallization (ATR) method for making a planar hybrid orientation substrate which includes one or more regions of a first single-crystal semiconductor with a first orientation, and one or more regions of a second single-crystal semiconductor with a second orientation, where both first and second semiconductor regions are disposed on a BOX layer created by a SIMOX treatment applied to both semiconductor regions.

Like the '446 application, the present application expands upon the methods of the '241 application by providing a SIMOX treatment to form a buried insulating layer under the second semiconductor regions. However, the SIMOX treatment in the present application is applied to both the first semiconductor region and the second semiconductor region, leaving both semiconductor regions disposed on buried insulating layers that are at least partially created by SIMOX.

FIELD OF THE INVENTION

The present invention relates to high-performance metal oxide semiconductor field effect transistors (MOSFETs) for digital or analog applications, and more particularly to MOSFETs utilizing carrier mobility enhancement from substrate surface orientation.

BACKGROUND OF THE INVENTION

In present semiconductor technology, complementary metal oxide semiconductor (CMOS) devices, such as nFETs (i.e., n-channel MOSFETs) or pFETs (i.e., p-channel MOSFETs), are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobilities on (110) Si are 2× higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

In view of the above, there is a need for providing integrated semiconductor devices that are formed upon a substrate having different crystal orientations that provide optimal performance for a specific device. A need also exists to provide a method to form such an integrated semiconductor device in which both the nFETs and the pFETs are formed on a silicon-on-insulator substrate having different crystallographic orientations in which the semiconducting layers that the devices are built upon are substantially coplanar and have substantially the same thickness.

Prior art approaches to this problem are shown in FIGS. 1-3. Specifically, FIGS. 1A-1F show the steps of a prior art epitaxial growth method described in U.S. Ser. No. 10/250,241 for making a planar hybrid orientation substrate comprising one or more regions of a first single-crystal semiconductor disposed on bulk silicon, said first semiconductor having a first orientation; and one or more regions of a second single-crystal semiconductor disposed on a BOX layer, said second semiconductor having a second orientation different from the first.

FIG. 1A shows an initial semiconductor-on-insulator (SOI) substrate 10 comprising a base semiconductor substrate layer 20 having a first orientation; a dielectric or buried oxide layer 30; an SOI layer 40 having a second orientation different from the first; and an optional surface dielectric masking/passivation layer 50. Layers 20, 30, and 40 of the initial SOI substrate 10 are typically formed by bonding two different semiconductor wafers together. The base semiconductor substrate layer 20 may optionally be substituted with any combination of semiconductor and insulating layers provided that an upper surface portion of the base semiconductor substrate includes a top layer of a single crystal semiconductor.

FIG. 1B shows the structure of FIG. 1A after one or more openings 60 are formed in layers 50, 40, and 30 to expose a surface of the base semiconductor substrate 20. As shown in FIG. 1C, sidewall spacers 70 may be formed on the exposed sidewalls of the openings 60. Next, a semiconductor material 80 having the same crystallographic orientation as that of the base semiconductor substrate 20 is epitaxially grown in the opening 60 on exposed surfaces of layer 20 and thereafter an optional planarization step can be utilized to form the structure of FIG. 1D. FIG. 1E shows the structure of FIG. 1D after additional planarization steps to remove the masking/passivation layer 50, and FIG. 1F shows the structure of FIG. 1E after optional formation of shallow trench isolation regions 90.

A drawback of the method described above and illustrated in FIGS. 1A-1F is that the processing leaves only one of the semiconductor orientations disposed on a BOX. FIGS. 2A-2F show the additional masking and SIMOX (separation by implanted oxygen) steps described in U.S. application Ser. No. 10/634,446 that can be applied to the structure of FIG. 1D, 1E, or 1F to selectively form a BOX layer in the one or more regions of the epitaxially grown semiconductor 80. FIG. 2A shows the structure of FIG. 1D after formation of a patterned mask 100 with a mask opening 110. FIG. 2B shows the structure of FIG. 2A being implanted with oxygen ions 120 to form an oxygen-rich silicon layer 130 and a damaged single crystal semiconductor region 140 in the semiconductor layer 80 exposed by the mask opening 110. FIG. 2C shows the structure of FIG. 2B after a high temperature annealing in an oxygen-containing ambient has converted the oxygen-rich silicon layer 130 into a buried oxide layer 150, and the damaged semiconductor region 140 into a device-quality semiconductor layer 140'. A surface oxide layer 170 also forms during the high temperature annealing step. FIG. 2D shows the structure of FIG. 2C after removal of the masking layers 50 and 100, removal of the surface oxide layer 170, and partial removal of the sidewall spacers 70. FIG. 2E shows the structure of FIG. 2D after optional formation of shallow trench isolation regions 190.

A drawback of the approach described above and illustrated in FIGS. 2A-2E is that it requires additional masking layers to protect the semiconductor layer 40 from the SIMOX implant and anneal. Use of such masking layers would typically require the additional steps of mask layer deposition, and lithographic alignment and patterning.

FIGS. 3A-3D outline an alternative amorphization/templated recrystallization (ATR) method described in U.S. Ser. No. 10/725,850 for making a planar hybrid orientation substrate having one or more regions of a first single-crystal semiconductor with a first orientation, and one or more regions of a second single-crystal semiconductor with a second orientation, where both first and second semiconductor regions are disposed on a BOX layer created by a SIMOX treatment applied to both semiconductor regions. FIG. 3A shows a bonded substrate 200 comprising a semiconductor substrate 210 having a first crystallographic orientation and a semiconductor layer 220 having a second orientation joined at a bonding interface 215. Selected regions of the substrate 200 are amorphized by a process such as ion implantation to produce the structure of FIG. 3B which includes an amorphized region 230 and non-amorphized regions 220'. The amorphized region 230 is then recrystallized with a process such as annealing to form a crystalline semiconductor 240 having the orientation of the semiconductor substrate 210, as shown in FIG. 3C. (Trenches or shallow trench isolation regions, not shown, would typically be formed at the boundaries between the amorphized and non-amorphized regions (230 and 220', respectively) of the semiconductor layer 220 to prevent lateral templating.) A buried oxide region 250 is then formed under the differently oriented semiconductor regions 220' and 240 by a SIMOX treatment applied to both semiconductor regions, as shown in FIG. 3D.

While the ATR approach illustrated in FIGS. 3A-3D is highly attractive, it (i) is less mature than epitaxial regrowth methods, and (ii) can be sensitive to oxides and contamination at the bonding interface 215.

In view of the above drawbacks with prior art approaches, there is a need for providing a method that is capable of creating a semiconductor substrate material having semiconductor layers of different crystallographic orientations that are substantially coplanar and of substantially the same thickness, yet are both located atop a buried insulating layer, e.g., a BOX layer.

SUMMARY OF THE INVENTION

One object of the present invention is to provide a method of fabricating integrated semiconductor devices such that different types of CMOS devices are formed upon a specific crystal orientation of a silicon-on-insulator (SOI) substrate that enhances the performance of each device.

Another object of the present invention is to provide a method of fabricating integrated semiconductor devices such that pFETs are located on a (110) crystallographic plane, while nFETs are located on a (100) crystallographic plane of the same SOI substrate.

A further object of the present invention is to provide a method of integrating SOI technology with CMOS technology using simple and easy processing steps.

A still further object of the present invention is to provide a method of forming an integrated semiconductor structure in which both CMOS devices, i.e., pFETs and nFETs, are SOI like.

Yet another object of the present invention is to provide a method of forming a hybrid orientation SOI substrate having differently oriented semiconductor layers that are substantially coplanar and have substantially the same thickness.

These and other objects and advantages are achieved in the present invention by utilizing bonding and epitaxial growth methods to form planar hybrid substrates comprising bonded semiconductor regions of one crystallographic orientation disposed directly on a first buried insulating layer, and epitaxially grown semiconductor regions of a different crystallographic orientation not disposed directly on the first buried insulating layer, and then applying a SIMOX-like treatment (including one or more ion implantation of oxygen or nitrogen steps and one or more annealing steps) to both the bonded and epitaxially grown semiconductor regions to (i) form a second buried insulating region in the epitaxially grown semiconductor material and (ii) thicken the first buried insulating layer underlying the bonded semiconductor layer. After removal of any surface oxides produced by the SIMOX annealing steps and an optional touch-up planarization step, the bonded semiconductor and the epitaxially grown semiconductor are left as SOI regions that are substantially coplanar and have substantially the same thickness.

At least one nFET and at least one pFET may then be formed on either the bonded semiconductor layer or the epitaxially grown semiconductor material depending on which surface orientation is optimal for that device. Both CMOS devices, i.e., the nFET and the pFET, are SOI-like devices since they are both located in a SOI layer disposed on a buried insulator.

In particular, the present invention provides a method of forming an integrated semiconductor structure comprising the steps of:

providing a substrate comprising a base semiconductor substrate layer having a first crystallographic orientation, the base semiconductor substrate layer separated by a first insulating layer from a top semiconductor layer of a second crystallographic orientation, said first crystallographic orientation being different from said second crystallographic orientation;

forming at least one opening in the substrate that exposes a surface of the base semiconductor substrate layer;

filling said at least one opening with an epitaxially grown semiconductor material on said exposed surface of the base semiconductor substrate layer, said epitaxially grown semiconductor material having a crystallographic orientation that is the same as the first crystallographic orientation; and implanting and annealing to (i) form a second insulating layer in the epitaxially grown semiconductor material, and (ii) thicken said first insulating layer underlying the top semiconductor layer.

Following the implanting and annealing step, an optional planarization and/or surface treatments may be used to provide a structure in which the remaining epitaxially grown semiconductor material having the first crystallographic orientation is substantially coplanar and of substantially the same thickness as that of the remaining top semiconductor layer.

The base semiconductor substrate layer described above may be disposed on any combination of semiconductor and insulating layers, including, for example, an auxiliary buried insulator layer. In this case, the steps of (i) forming a second insulating layer within the epitaxially grown semiconductor material, and (ii) thickening said first insulating layer underlying the top semiconductor layer are more precisely described, respectively, as extending the auxiliary buried insulator layer upwards (i) into the epitaxially grown semiconductor, and (ii) up to the first insulating layer underlying the top semiconductor layer.

The present invention also encompasses a variation of the above method in which the first insulating layer separating the base semiconductor substrate layer and the top semiconductor layer is omitted, leaving the base and top semiconductor layers in direct contact at a semiconductor-to-semiconductor interface. In this version, the ion implantation and annealing process is implemented so as to leave the top of the resulting second insulating layer at, or above, the level of the semiconductor-to-semiconductor interface.

DETAILED DESCRIPTION OF THE INVENTION

Figure 1A:
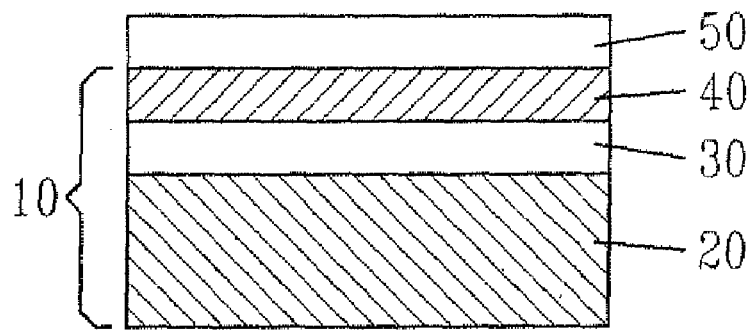
FIGS. 1A-1F illustrate, in cross section views, the steps of a prior art method to form a planar hybrid orientation substrate in which some of the semiconductor regions are on a BOX layer, while other semiconductor regions are not.
Figure 1B:
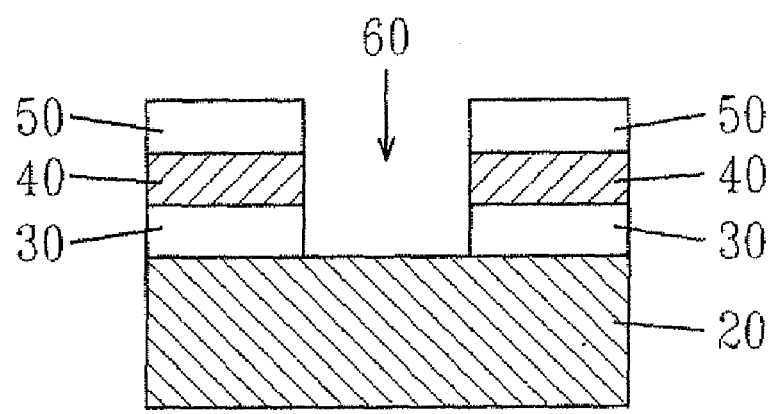
Figure 1C:
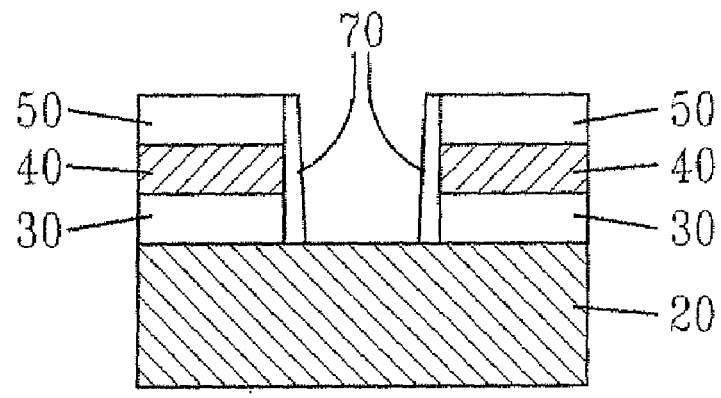
Figure 1D:
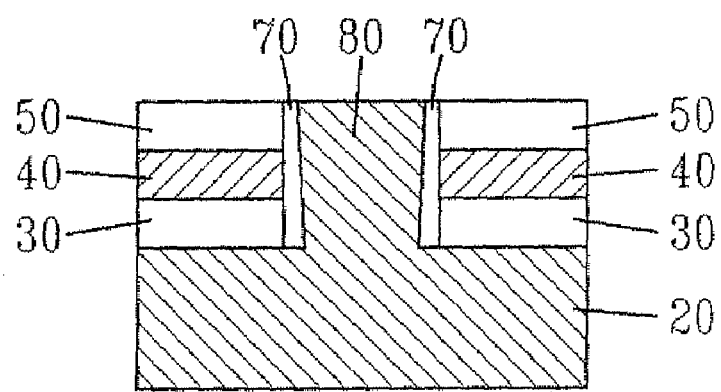
Figure 1E:
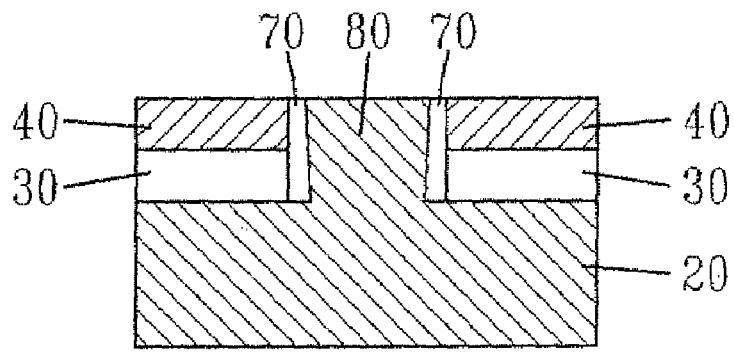
Figure 1F:
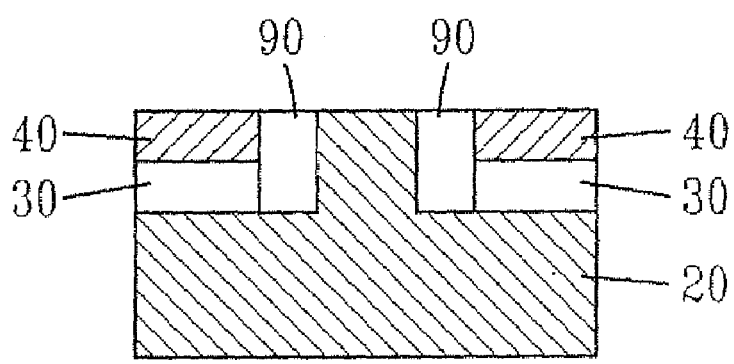
Figure 2A:
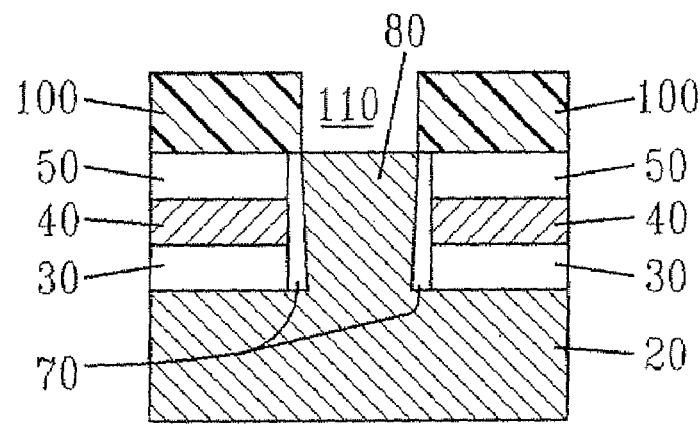
FIGS. 2A-2E illustrate, in cross section views, a prior art extension of the method shown in FIGS. 1A-1F to produce a planar hybrid orientation substrate in which both semiconductor orientations are on a BOX layer.
Figure 2B:
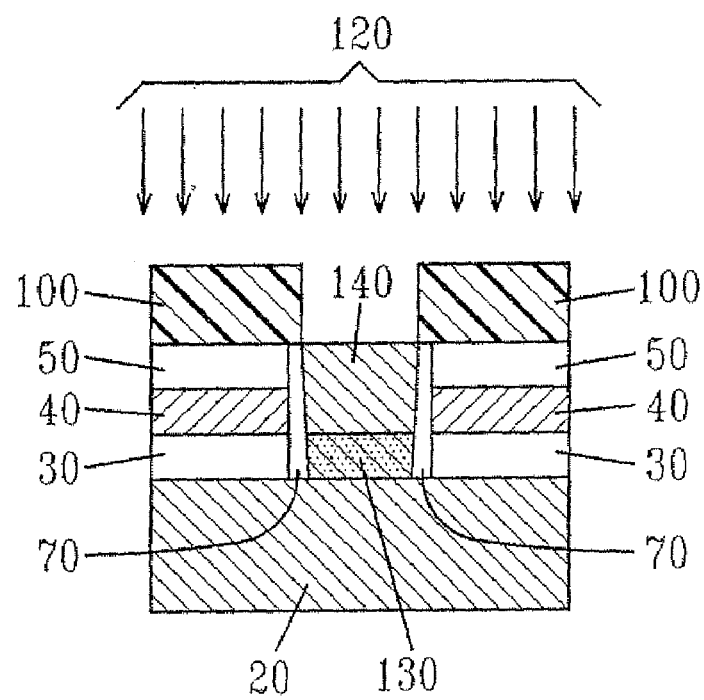
Figure 2C:
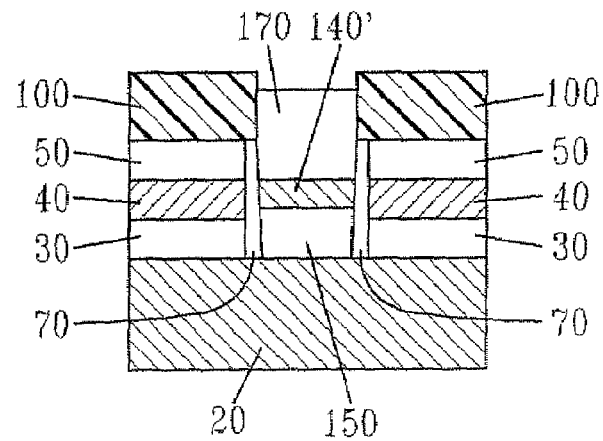
Figure 2D:
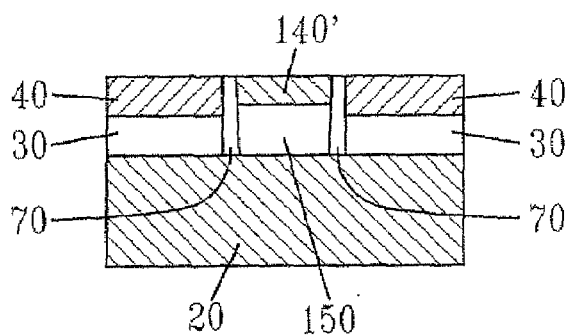
Figure 2E:
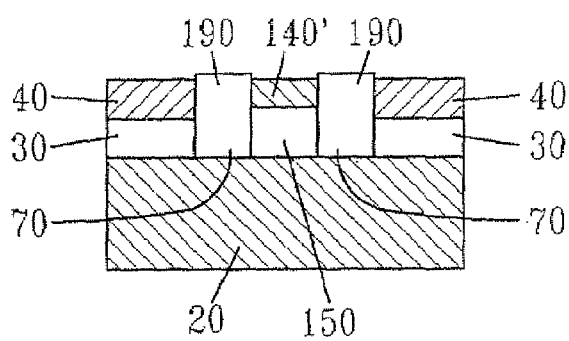
Figure 3A:
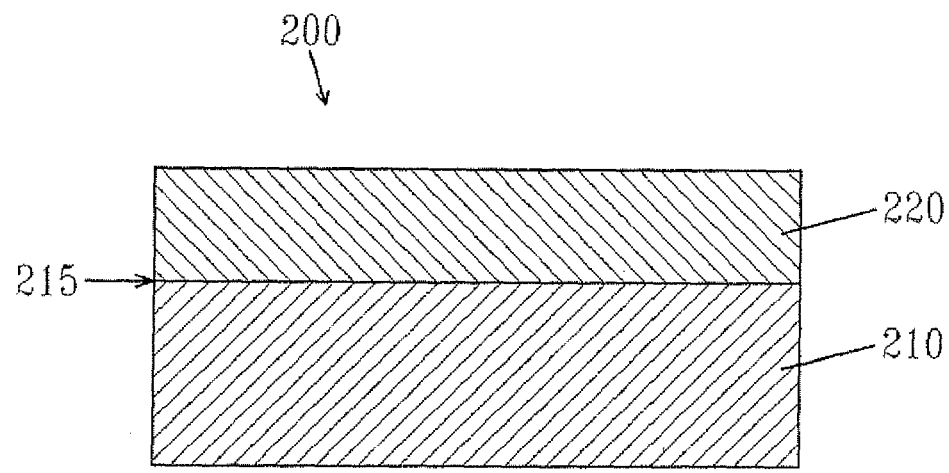
FIGS. 3A-3D illustrate, in cross section views, the steps of a prior art amorphization/templated recrystallization (ATR) method to produce a planar hybrid orientation substrate in which both semiconductor orientations are on a BOX layer.
Figure 3B:
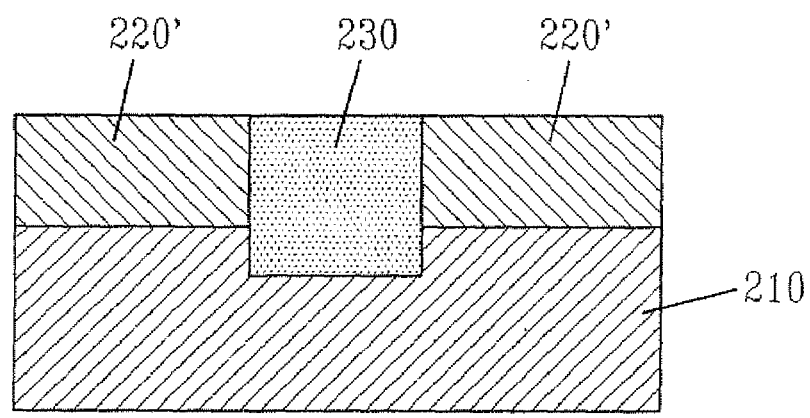
Figure 3C:
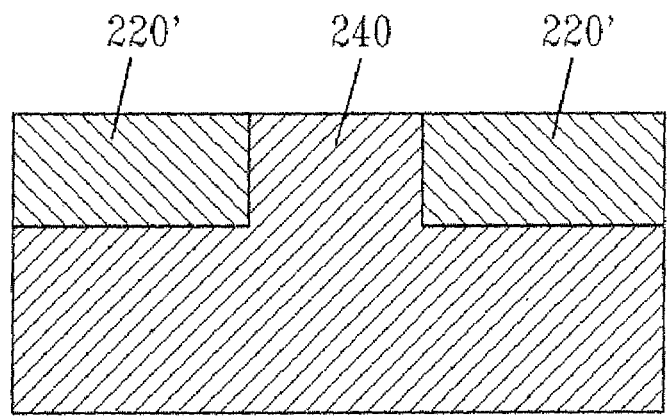
Figure 3D:
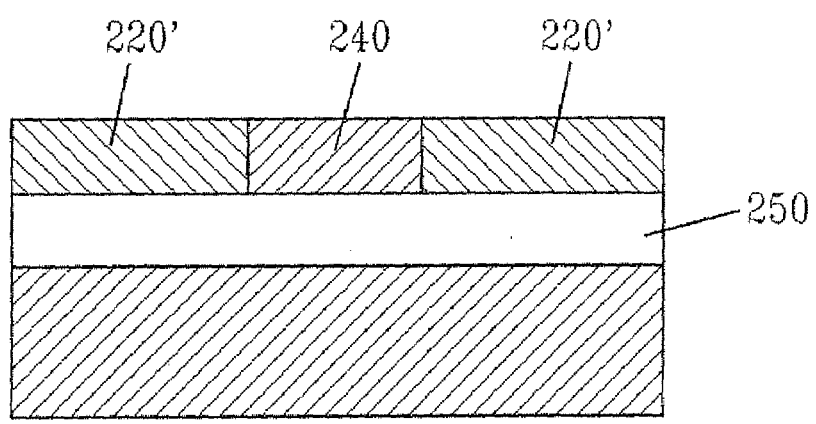

The present invention, which provides double SIMOX HOT (hybrid orientation technology) substrates, will now be described in more detail by referring to the drawings that accompany the present application. In the accompanying drawings, like and corresponding elements are referred to by like reference numerals. It is noted that the drawings of the present application are provided for illustrative purposes and are thus not drawn to scale.

Figure 4A:
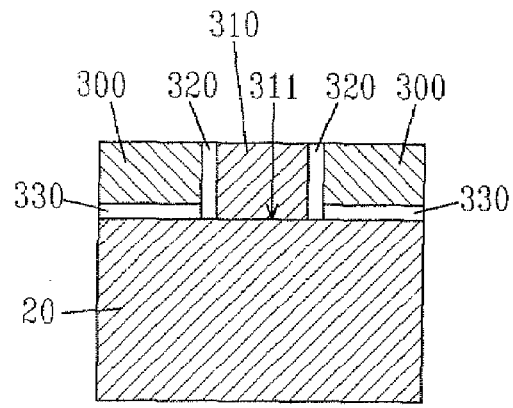
FIGS. 4A-4H illustrate, in cross section views, possible initial substrates that can be employed in the present invention.
Figure 4B:
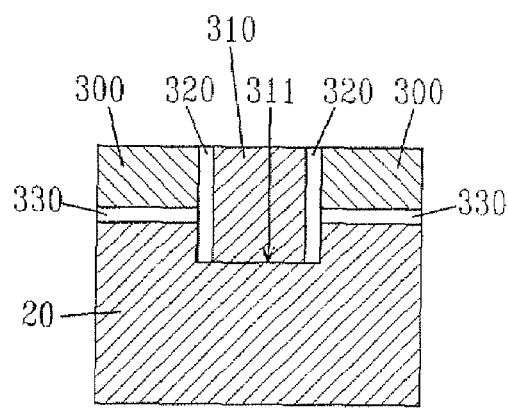
Figure 4C:
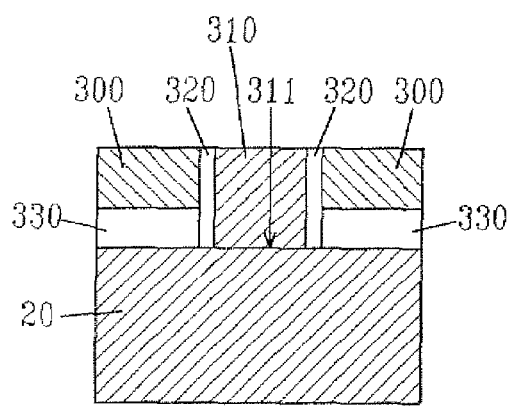
Figure 4D:
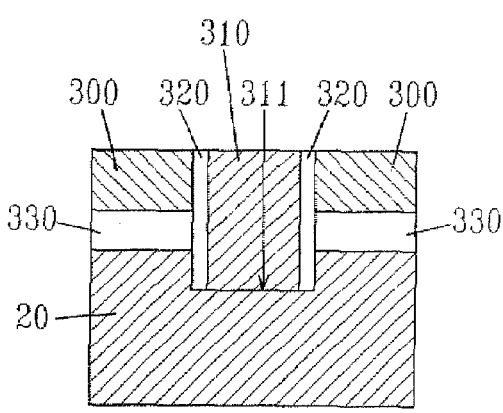
Figure 4E:
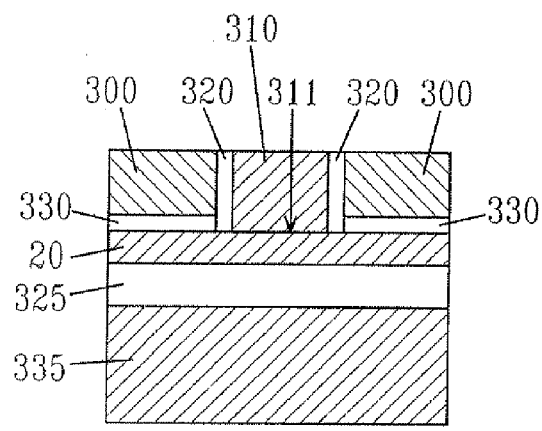
Figure 4F:
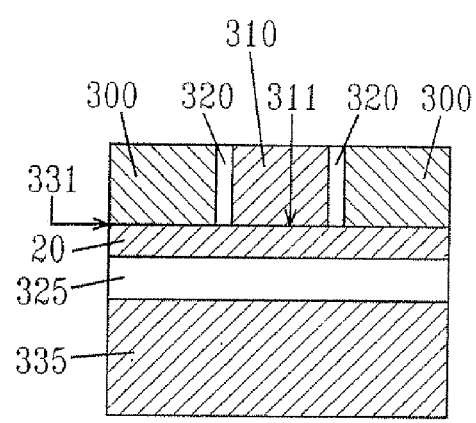
Figure 4G:
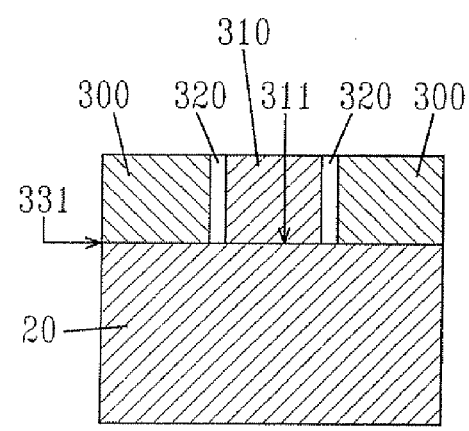

FIGS. 4A-4H show, in cross section view, possible initial substrates that can be employed in the present invention. The initial substrates of FIGS. 4A-4H are all planar, hybrid orientation substrates comprising a base semiconductor substrate layer 20 having a first orientation, and one or more top semiconductor layers or regions 300 having a second orientation different from the first orientation. The one or more top semiconductor regions 300 are typically formed by bonding utilizing the procedures described in the '241 application that was previous incorporated herein by reference. The one or more top semiconductor regions 300 may be disposed on a first insulating layer 330 (as shown in FIGS. 4A-4D and 4H) or they may be disposed directly on the base semiconductor substrate layer 20 (as shown in FIGS. 4F and 4G), to form an interface 331. The first insulating layer 330 may comprise an oxide or nitride, and it typically has a thickness from about 2 to about 200 nm.

The base semiconductor substrate layer 20 may be disposed on any combination of semiconductor and insulating layers. In the structures of FIGS. 4A-4D and 4G-4H, the base semiconductor substrate layer 20 comprises a bulk semiconductor substrate wafer. In the structures of FIGS. 4E and 4F, the base semiconductor substrate layer 20 is disposed on an auxiliary buried insulator layer 325 situated on a substrate 335. The auxiliary buried insulator layer 325 comprises an oxide or nitride and it typically has a thickness from about 50 to about 500 µm. The substrate 335 includes one of the semiconductor materials mentioned below.

The base semiconductor substrate layer 20 comprises any type of semiconducting material including, for example, Si, SiC, SiGe, SiGeC, Ge, GaAs, InAs, InP as well as other III/V or II/VI compound semiconductors. The base semiconductor substrate layer 20 may also comprise a combination of these semiconductor materials. The base semiconductor substrate layer 20 may be strained, unstrained or a combination of strained and unstrained layers can be used. The base semiconductor substrate layer 20 is also characterized as having a first crystallographic orientation which may be, for example, (110), (111) or (100).

The one or more top semiconductor layers 300 include one of the above mentioned semiconductor materials.

Hence, it is possible in the present invention that the one or more top semiconductor layers 300 comprise the same semiconductor material as the base semiconductor substrate layer 20, or they may comprise a different semiconductor material than the base semiconductor substrate layer 20. As indicated above, the one or more top semiconductor layers 300 have a second crystallographic orientation that is different from the first crystallographic orientation of the base semiconductor substrate layer 20.

One or more epitaxially grown semiconductor regions 310 are disposed directly on the base semiconductor substrate layer 20 and separated from the one or more top semiconductor layers 300 by (preferably insulating, i.e., oxide, nitride, oxynitride and combinations, including multilayers, thereof) sidewall spacers 320. The epitaxially grown semiconductor regions 310 are comprised of one of the above mentioned semiconductor materials (which may be the same semiconductor material or a different semiconductor than the base semiconductor substrate layer 20) and have the same crystallographic orientation as that of the base semiconductor substrate layer 20. The lines that are labeled by reference numeral 311 in FIGS. 4A-4H are used to indicate the position of the invisible interface between the base semiconductor substrate layer 20 and the epitaxially grown semiconductor regions 310.

Figure 4H:
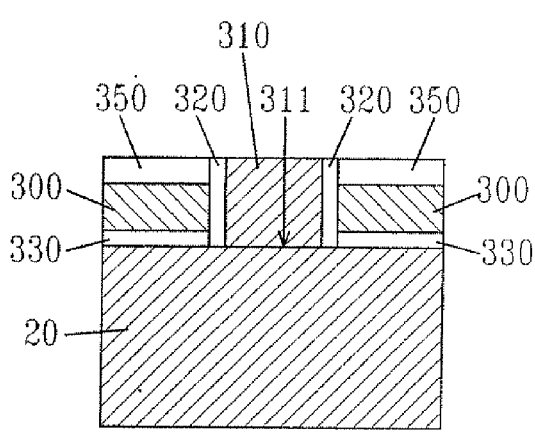

The substrates of FIGS. 4A-4G may also include a residual masking layer 350 (such as shown in FIG. 4H for the case of the structure of FIG. 4A) if the masking layer 350 is thin enough not to substantially interfere with the subsequent SIMOX (separation by implanted oxygen) steps. If present, the masking layer 350 is comprised of an insulating material such as, for example, an oxide or nitride. The thickness of the masking layer 350 is typically from about 20 to about 50 nm.

The structures of FIGS. 4A-4D differ in the thickness of the first insulating layer 330 (note the first insulating layer and the second insulating layer to be subsequently formed can both be referred to as buried insulator regions) and the depth of sidewall spacers 320. The structures of FIGS. 4A and 4B have a thin first insulating layer 330, typically between 1 and 20 nm in thickness, and more typically between 2 and 10 nm in thickness; the structures of FIGS. 4C and 4D have a thicker first insulating layer 330, typically between 20 and 1000 nm in thickness, and more typically between 50 and 200 nm in thickness. The sidewall spacers 320 extend to the bottom of the first insulating layer 330 in the structures of FIGS. 4A and 4C, and past the first insulating layer 330 into the base semiconductor substrate layer 20 in the structures of FIGS. 4B and 4D.

It is again noted that the structures of FIGS. 4A-4G and the like may be fabricated by methods and with materials known to the art, for example, by the methods described in connection with FIGS. 1A-1F, and the methods and materials described in previously incorporated U.S. patent application Ser. Nos. 10/250,241 and 10/634,446.

FIGS. 5A-5E and 6A-6D outline how a SIMOX-like treatment (including one or more oxygen or nitrogen ion implantation steps and one or more annealing steps) can be applied to the structures shown in FIGS. 4A-4H. In particular, illustration is provided for the particular cases of the structure shown in FIGS. 4A and 4E (where the first insulating layer 330 is present and thin). FIGS. 5A-5E illustrate this for the case of the initial structures without the auxiliary buried insulator 325 and FIGS. 6A-6D illustrate this for the case of the initial structures with the auxiliary buried insulator 325.

Specifically, FIGS. 5A-5E outline how a SIMOX-like treatment cant be applied to both the one or more top semiconductor regions 300 and the epitaxially grown semiconductor regions 310 to (i) form a second buried insulating layer within the epitaxially grown semiconductor regions 310 and (ii) thicken the first buried insulating layer 330 (or other dielectric layer) underlying the top semiconductor layer 300.

Figure 5A:
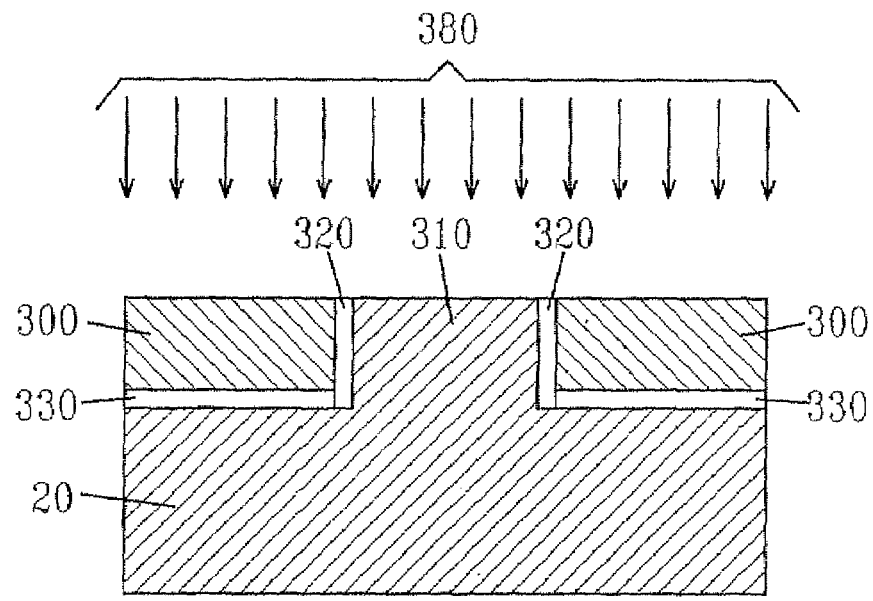
FIGS. 5A-5E illustrate, in cross section views, the inventive steps of the present method to produce a planar hybrid orientation substrate starting from a base semiconductor layer on a bulk substrate.

FIG. 5A shows the first step of this process for an initial substrate having the structure of FIG. 4A. Ions 380, such as oxygen or nitrogen, are implanted into the structure of FIG. 5A to produce the structure shown in FIG. 5B with a buried implant region 400 below the top surfaces of the one or more top semiconductor layers 300 and the epitaxially grown semiconductor regions 310, now denoted as damaged bonded semiconductor regions 300' and damaged epitaxially grown semiconductor regions 310' respectively. The buried implant region 400 contains a high concentration of implanted species that is capable of forming a second buried insulating layer 410 during a subsequent high temperature annealing step. The depth and extent of the implant region 400 is selected so that the second buried insulating layer 410 subsequently to be formed from the implant region 400 will have the desired depth alignment with the first buried insulating layer 330, the position of which is indicated by 370. The second buried insulating layer 410 is centered around position 370 of the first buried insulating layer 330 in the structure of FIG. 5C, centered above position 370 in the structure of FIG. 5D, and centered below position 370 in the structure shown in FIG. 5E.

Figure 6A:
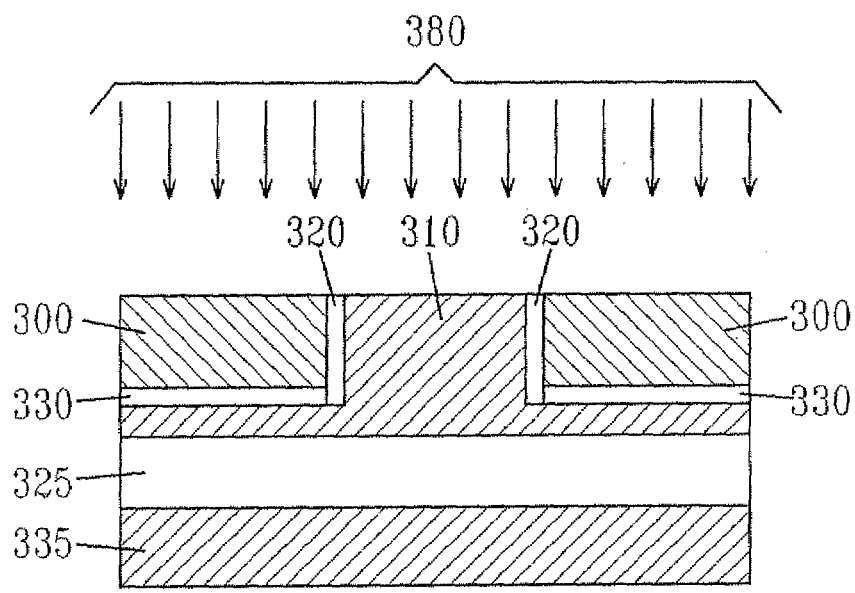
FIGS. 6A-6D illustrate, in cross section views, the steps of the present inventive method to produce a planar hybrid orientation substrate starting from a base semiconductor layer on a buried insulator layer substrate.
Figure 6B:
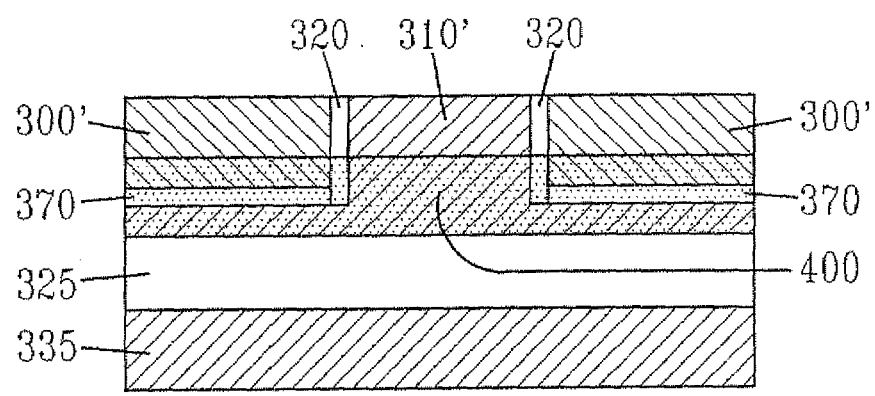
Figure 6C:
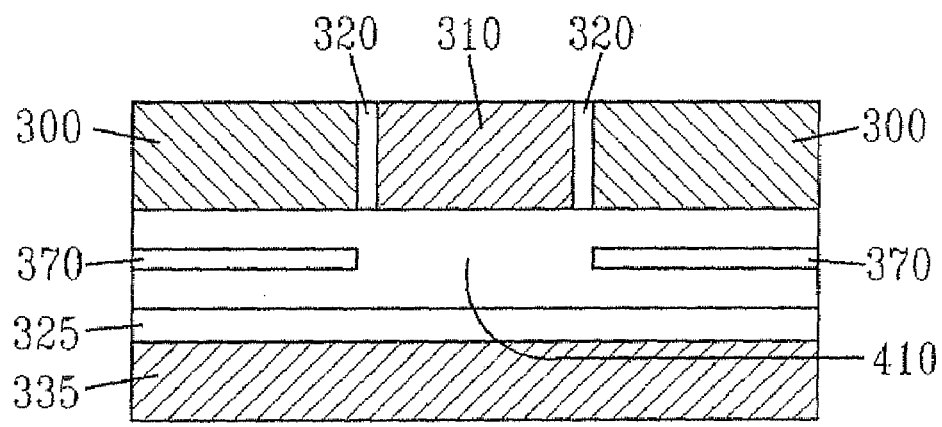
Figure 6D:
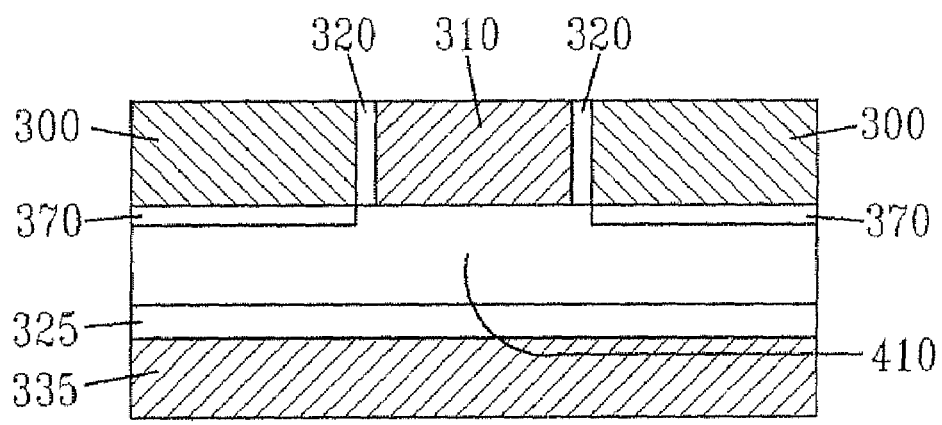

FIGS. 6A-6D outline how a SIMOX-like treatment can be applied to both the one or more top semiconductor regions 300 and the epitaxially grown semiconductor regions 310 to extend the auxiliary buried insulator 325 upwards (i) into the epitaxially grown semiconductor 310, and (ii) up to the first insulating layer 330 underlying the semiconductor base substrate layer 20. FIG. 6A shows the first step of this process for an initial substrate having the structure of FIG. 4E. Ions 380, such as oxygen or nitrogen, are implanted into the structure of FIG. 6A to produce the structure shown, for example, in FIG. 6B with the buried implant region 400. The buried implant region 400 is situated below the top surfaces of the one or more top semiconductor regions 300 and the epitaxially grown semiconductor regions 310, now denoted as damaged bonded semiconductor regions 300' and damaged epitaxially grown semiconductor regions 310', respectively, and extends into the auxiliary buried insulator 325. In this embodiment, the implant region 400 contains a high concentration of implanted species which is capable of forming the second buried insulating layer 410 during a subsequent high temperature annealing step. The depth and extent of the implant region 400 is selected so that the second buried insulating layer 410 subsequently to be formed from the implant region 400 will have the desired depth alignment with the first buried insulating layer 330, the position of which is indicated by 370. The second buried insulating layer 410 may extend above position 370 of the first insulating layer 330, as shown in FIG. 6C, but preferably ends at position 370, as shown, for example, in FIG. 6D.

While FIGS. 5A-5E and 6A-6D illustrate the application of a SIMOX treatment to structures having a thin first buried insulating layer 330, it is noted that the present invention also applies to structures in which the first insulating layer 330 is thicker and to structures without the first insulating layer 330. In the case without first insulating layer 330, the ion implantation and annealing process is implemented so as to leave the top of the resulting second insulating layer at, or above, the level of the semiconductor-to-semiconductor interface. However, buried insulator formation with SIMOX treatments tends to be easier when the initial structure has at least some buried insulator (330 or 325) present.

The ion implantation used to create the buried implant layer 400 may include various well-known ion implantation conditions (see, for example, G. K. Celler and S. Cristoloveanu, J. Appl. Phys. 93 4955 (2003)), including for example, the following high dose and low dose ion implantation conditions:

High Dose Implantation:

The term "high dose" as used herein denotes an $O^+$ ion dosage of about 4E 17 $cm^{-2}$ or greater, with an ion dosage from about 4E17 to about 2E18 $cm^{-2}$ being more preferred. In addition to using high dosage, this implant is typically carried out in an ion implantation apparatus at an energy from about 10 to about 1000 keV. An implant energy from about 60 to about 250 keV is more typically used.

This implant, which may also be referred to as a base ion implant, is carried out at a temperature from about 200° to about 800° C. at a beam current density from about 0.05 to about 50 $\mu A\ cm^{-2}$. More preferably, the base ion implant may be carried out at a temperature from about 200° to about 600° C. at a beam current density from about 5 to about 20 $\mu A\ cm^2$.

If desired, the base implant step may be followed by a second $O^+$ implant that is carried out using a dose from about 1E14 to about 1E16 $cm^{-2}$, with a dose from about 1E15 to about 4E15 $cm^{-2}$ being more highly preferred. The second implant is carried out at an energy from about 40 keV or greater, with an energy from about 120 to about 450 keV being more preferred.

This second implant is performed at a temperature from about 4K to about 200° C. with a beam current density from about 0.05 to about 10 $\mu A\ cm^{-2}$. More preferably, the second implant may be performed at a temperature from about 25° to about 100° C. with a beam current density from about 0.5 to about 5.0 $\mu A\ cm^{-2}$.

When employed, the second implant forms an amorphous region below the damaged region caused by the base ion implant step. During the subsequent annealing, the amorphous and damaged regions are converted into the second buried insulating region described above.

Low Dose Implantation:

The term "low dose" as used herein for this embodiment of the present invention denotes an ion dose of about 4E17 $cm^{-2}$ or less, with an ion dose from about 1E17 to about 3.9E17 $cm^{-2}$ being more preferred. This low dose implant is performed at an energy from about 40 to about 500 keV, with an implant energy from about 60 to about 250 keV being more highly preferred.

This low dose implant, which may be referred to as a base ion implant, is carried out at a temperature from about 100° to about 800° C. More preferably, the base ion implant may be carried out at a temperature from about 200° to about 650° C. The beam current density used in the low dose implant is from about 0.05 to about 50 $\mu A\ cm^{-2}$.

If desired, the base low dose implant step may be followed by a second O+ implant that is carried out using the conditions mentioned above.

It is again emphasized that the above types of ion implantations are exemplary and by no way limit the scope of the present invention. Instead, the present invention contemplates all conventional ion implant conditions, annealing conditions, and combinations of ion implant and anneal sequences found useful for SIMOX processing in more conventional substrates.

Figure 5B:
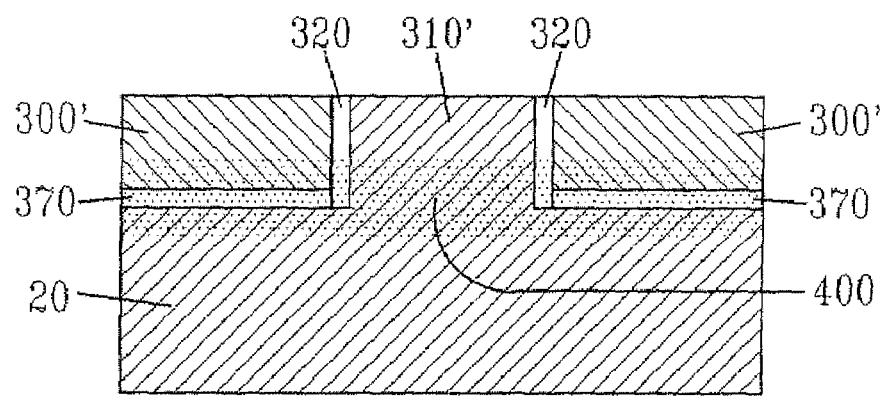
Figure 5C:
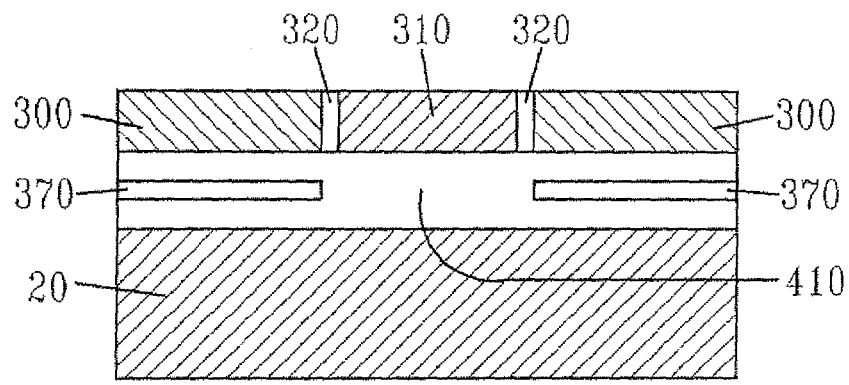
Figure 5D:
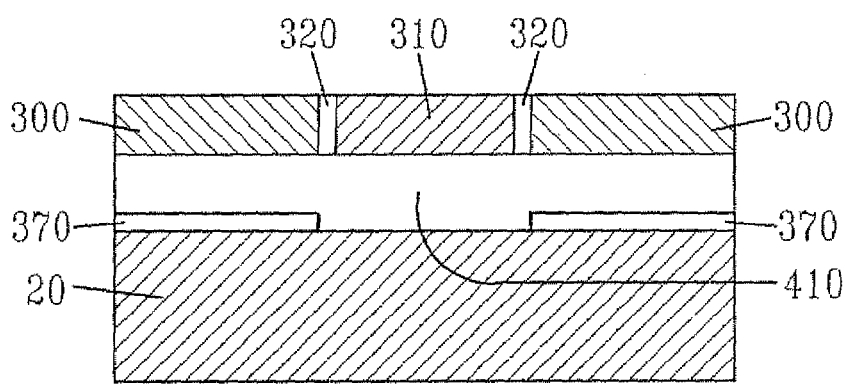
Figure 5E:
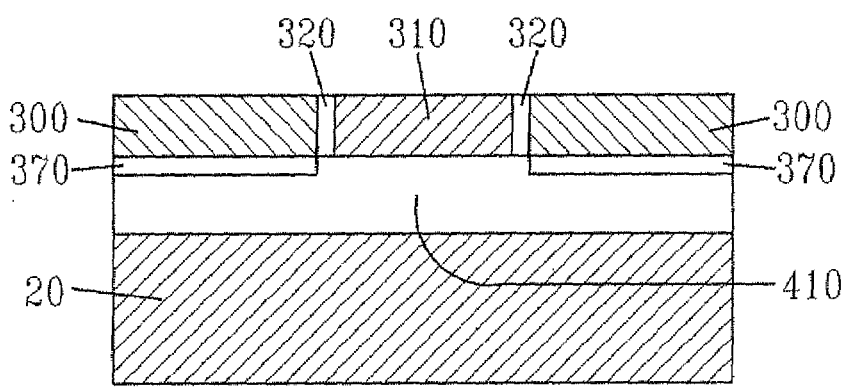

After ion implantation, the structures of FIGS. 5B and 6B, including the implant regions 400, are subjected to a high temperature annealing process that is capable of converting the implant region 400 into the second buried insulating layer 410. As described above, the second buried insulating layer 410 is preferably created with the desired depth alignment with respect to the first buried insulating layer 330. This annealing process also converts damaged semiconductor regions 300' and damaged epitaxially grown semiconductor regions 310' into a device quality semiconductor regions 300" and 310".

Specifically, the annealing step of the present invention is performed at a temperature from about 700° to about 1400° C., with a temperature from about 1100° to about 1300° C. being more highly preferred. Moreover, the annealing step of the present invention is carried out in an oxidizing ambient. The oxidizing ambient used during the annealing step includes at least one oxygen-containing gas such as $O_2$, NO, $N_2O$, ozone, air as well as other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The annealing step may be carried out for a variable period of time, which typically ranges from about 1 to about 100 hours, with a time period from about 2 to about 24 hours being more highly preferred. The annealing step may be carried out at a single targeted temperature, or with various ramp and soak cycles using various ramp rates and soak times.

Figure 7A:
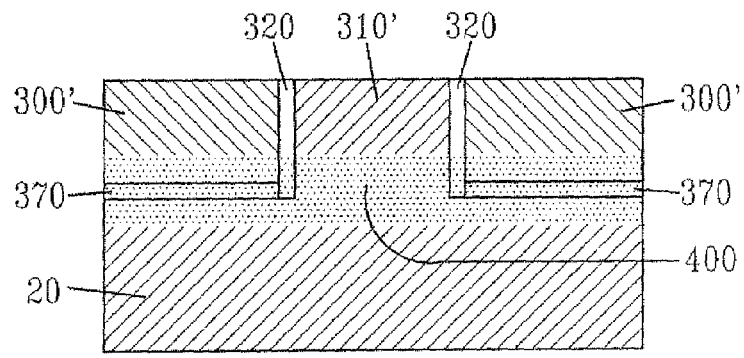
FIGS. 7A-7C illustrate, in cross section views, one method of performing the annealing steps of an ion implantation and annealing process.
Figure 7B:
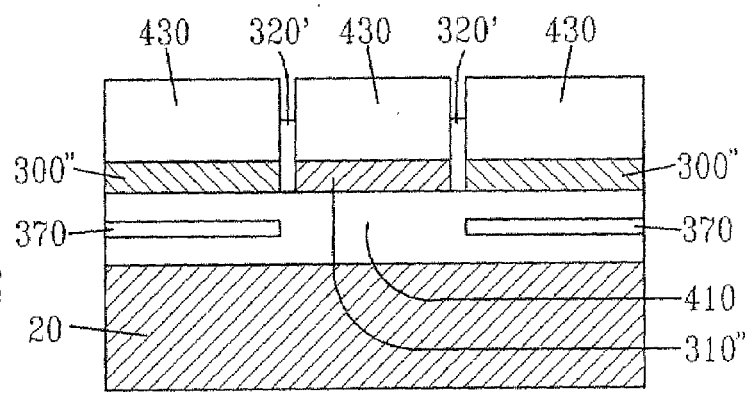
Figure 7C:
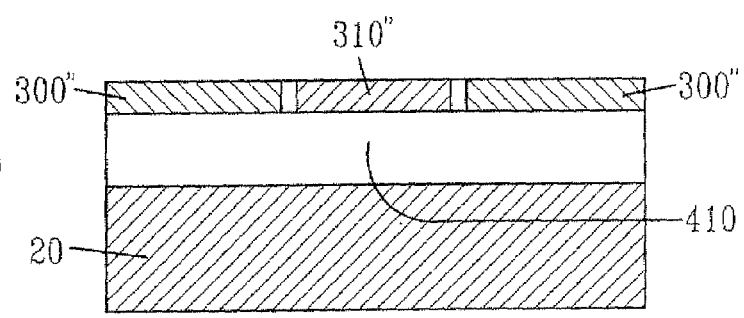

Because the annealing is performed in an oxidizing ambient, an upper portion of the semiconductor materials 300' and 310' is expected to oxidize if no barrier layer is present, as shown in FIGS. 7A-7C. Specifically, FIG. 7A shows a typical implanted structure before annealing, while FIG. 7B shows the structure of FIG. 7A after formation of a surface oxide layer 430. For the case of Si semiconductors, the surface oxide layer 430 would have a thickness approximately equal to twice the thickness of the consumed silicon.

Referring now to FIG. 7B, the surface oxide layer 430, along with the masking layer 350 (if present) and at least a portion of the sidewall spacers 320 are removed selectively with respect to the semiconductor material. This step may be referred to as a planarization process since it provides the planar structure shown in FIG. 7C. An example of a wet chemical etch solution that selectively removes oxide as compared to semiconductor material is buffered HF. Because the spacers 320 are typically located in the isolation region (instead of the active device region), recess or removal of the spacers 320 is acceptable. Damaged spacers 320' can be replaced or repaired during the formation of trench isolation regions.

Figure 8A:
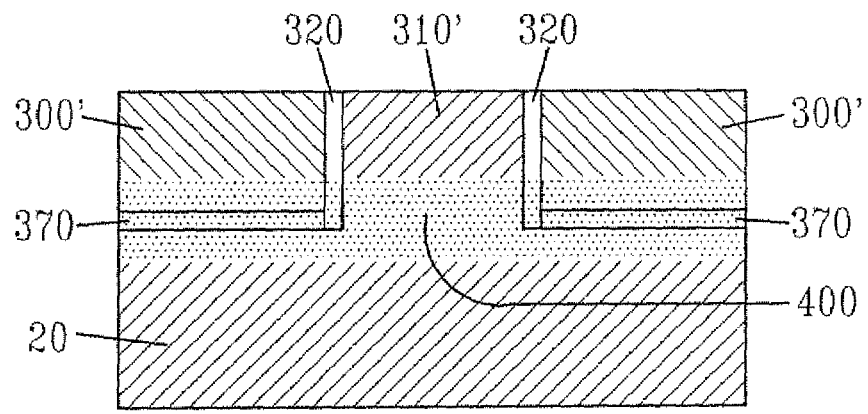
FIGS. 8A-8D illustrate, in cross section views, an alternative method of performing the annealing steps of an ion implantation and annealing process.
Figure 8B:
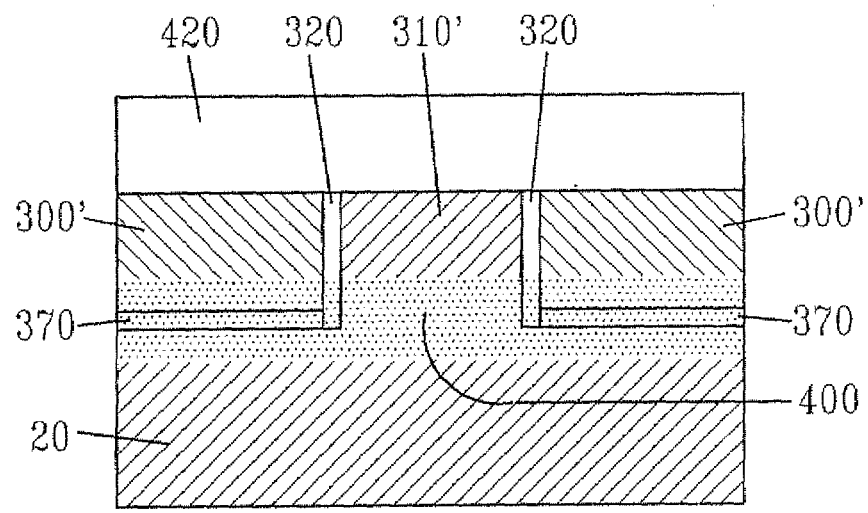
Figure 8C:
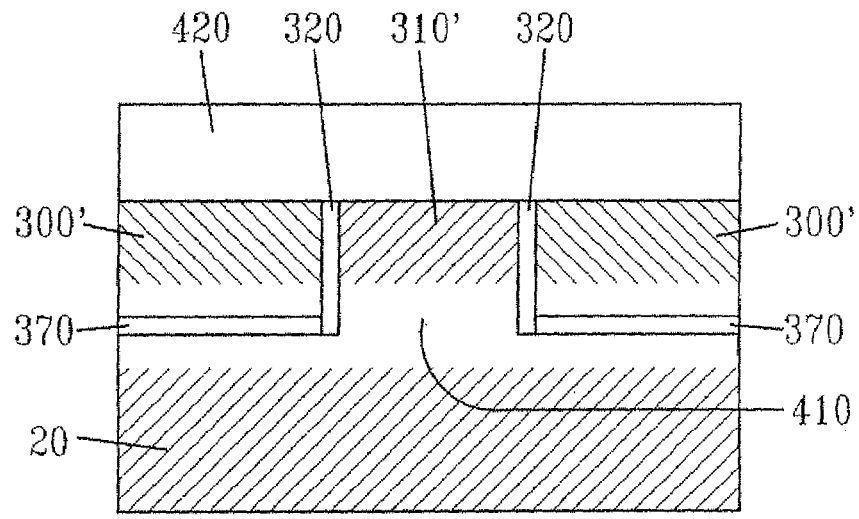

FIGS. 8A-8D illustrate an alternative method of performing the annealing steps needed for the ion implantation and annealing process, one that uses a barrier layer to prevent or reduce semiconductor surface oxidation. FIG. 8A shows a typical implanted structure before annealing. FIG. 8B shows the structure of FIG. 8A after deposition of a deposited layer 420. The deposited layer 420 may comprise a single material or a layered stack of materials, but is preferably thermally stable, non-reactive with respect to the underlying semiconductor regions, and easy to selectively remove after the anneal. Preferred materials for layer 420 include $SiO_2$, $SiN_x$, $SiN_x/SiO_2$ bilayers with $SiN_x$ as the bottom (etch stop) layer, and any of these layers with overlayers of Si thin enough to be completely converted to $SiO_2$ during the anneal. Barrier layer thicknesses are preferably in the range from 30 to 300 nm, and more preferably in the range from 50 to 100 nm.

After the high temperature anneal and optional planarization steps, at least one nFET and at least one pFET may then be formed on either bonded semiconductor regions 300" or epitaxially grown semiconductor regions 310", depending on which surface orientation is optimal for that device. FIG. 9 shows nFET 550 and pFET 560 optimally arranged on the substrate structure of FIG. 7C or 8D after the sidewall spacers 320 have been incorporated into shallow trench isolation regions 520.

The one or more nFETs 550 and pFETs 560 are formed utilizing standard CMOS processing steps that are well-known to those skilled in the art. As described in U.S. patent application Ser. No. 10/634,446, each FET includes a gate dielectric, a gate conductor, an optional hard mask located atop the gate conductor, spacers located on sidewalls of at least the gate conductor, and diffusion regions. The pFETs would typically be formed over a semiconductor material that has a (110) or (111) orientation, whereas the nFETs would typically be formed over a semiconductor surface having a (100) or (111) orientation.

It should be noted that while the second buried insulating layer 410 is shown as having a uniform thickness, it may have different thicknesses under different semiconductor regions. For example, the second buried insulating layer 410 may have one thickness in "all-SIMOX" regions (where the SIMOX-created buried insulator is created in the epitaxially grown semiconductor regions 310) and another in "part-SIMOX" regions (where the SIMOX-created buried insulator augments originally present first buried insulating layer 330). The thickness of the second buried insulating layer 410 can be affected by a number of factors including (i) the thickness of the original buried insulating layer 330, and (ii) the semiconductor orientations in which (or between which) the SIMOX buried insulator, i.e., second buried insulating layer 410, is formed (since chemical reactivity, semiconductor/oxide interface stability, and diffusion rates can be highly orientation dependent).

Figure 8D:
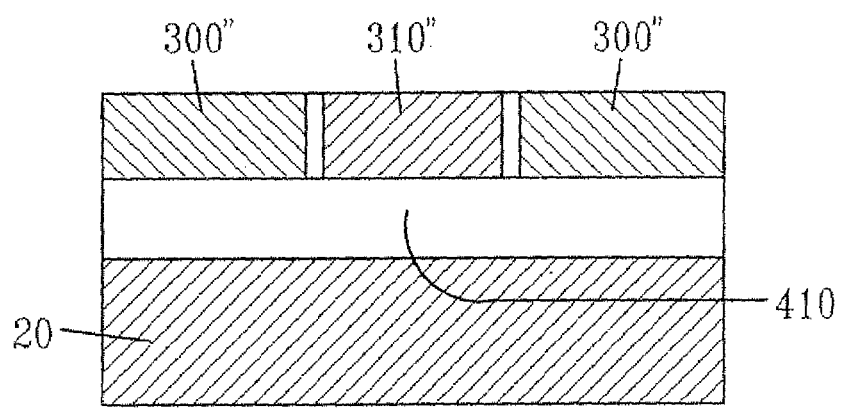
Figure 9:
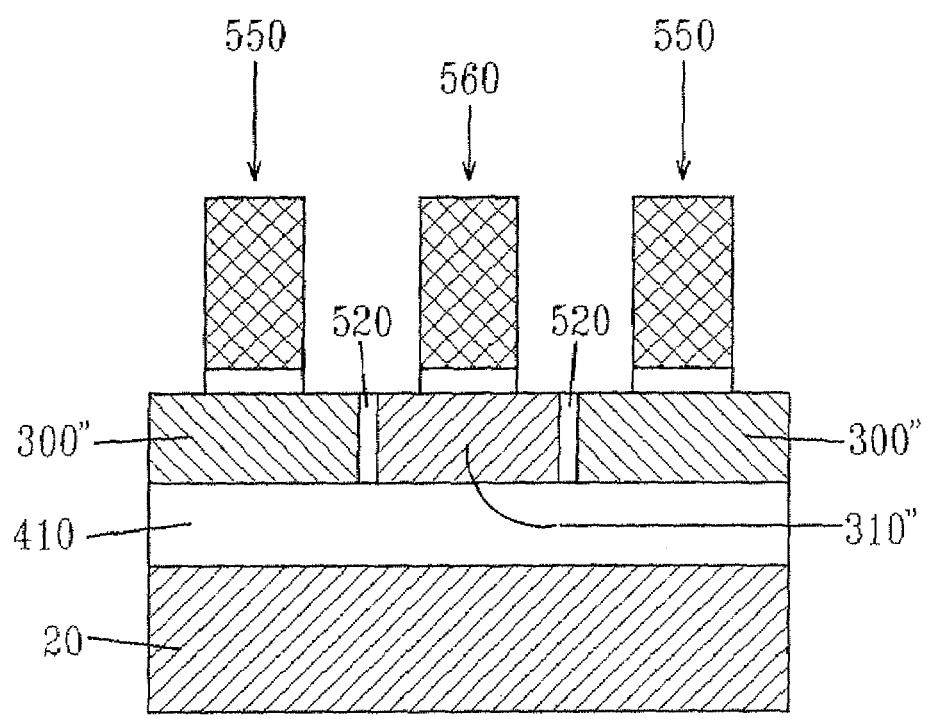
FIG. 9 illustrates, in cross section view, how the substrate structures of the present invention may be utilized to produce integrated semiconductor structures containing an nFET and a pFET formed on a coplanar surface of different crystallographic orientations, but with substantially the same SOI thickness.

Since it is typically more difficult to create a SIMOX buried oxide layer in 110-oriented Si than in 100-oriented Si, a preferred route to the uniform-thickness buried insulator structures of FIG. 7C or 8D for the case of Si semiconductors with 110 and 100 orientations would utilize Si with a 110 orientation as the bonded semiconductor layer 300, and Si with a 100 orientation as the substrate 20 and the epitaxially grown semiconductor layer 310. With this approach, the all-SIMOX buried oxide would be formed in 100 Si, and the part-SIMOX buried insulator would be formed at or around a Si(110)/Si(100) interface. The first buried insulating layer 330 would preferably have a thickness selected to compensate for the expected orientation-related differences in the thicknesses of the SIMOX-created portion of the buried insulator, thereby allowing the second buried insulating layer 410 to have a substantially uniform thickness.

Alternatively, for cases in which the thickness of a SIMOX-created buried insulator layer is relatively insensitive to semiconductor orientation (e.g., for certain SIMOX conditions and/or types of semiconductor materials), the thickness of the first buried insulating layer 330 would preferably be thin as possible.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

We claim:

1. A method of forming an integrated semiconductor structure comprising the steps of:
   providing a substrate comprising a base semiconductor substrate layer having a first crystallographic orientation, the base semiconductor substrate layer separated by a first insulating layer from a top semiconductor layer of a second crystallographic orientation, said first crystallographic orientation being different from said second crystallographic orientation;
   forming at least one opening in the substrate that exposes a surface of the base semiconductor substrate layer;
   filling said at least one opening with an epitaxially grown semiconductor material on said exposed surface of the base semiconductor substrate layer, said epitaxially grown semiconductor material having a crystallographic orientation that is the same as the first crystallographic orientation; and
   implanting and annealing to (i) form a second insulating layer in the epitaxially grown semiconductor material, and (ii) thicken said first insulating layer underlying the top semiconductor layer.

2. The method of claim 1 wherein the base semiconductor substrate layer is disposed on a bulk semiconductor substrate.

3. The method of claim 1 wherein the base semiconductor substrate layer is disposed on an auxiliary buried insulator layer, and said implanting and annealing is utilized to extend said auxiliary buried insulator upwards (i) into the epitaxially grown semiconductor material, and (ii) at least up to the first insulating layer underlying the top semiconductor layer.

4. The method of claim 1 wherein said first insulating layer separating the base semiconductor substrate layer and the top semiconductor layer is omitted, leaving the base and top semiconductors in direct contact at a semiconductor-to-semiconductor interface, and said implanting and annealing is utilized to produce a buried insulator whose top surface is at or above said semiconductor-to-semiconductor interface.

5. The method of claim 1 wherein the base semiconductor substrate layer is disposed on an auxiliary buried insulator layer, said first insulating layer separating the base semiconductor substrate layer and the top semiconductor layer is omitted, leaving the base and top semiconductor layers in direct contact at a semiconductor-to-semiconductor interface, and said implanting and annealing is utilized to extend said auxiliary buried insulator upwards (i) into the epitaxially grown semiconductor material, and (ii) at least up to said semiconductor-to-semiconductor interface.

6. The method of claim 1 further comprises a step of planarizing the implanted and annealed semiconductor materials to provide a structure in which the epitaxially grown semiconductor material having the first crystallographic orientation is substantially coplanar and of substantially the same thickness as that of the top semiconductor layer.

7. The method of claim 1 wherein the implanting comprises implanting oxygen or nitrogen ions.

8. The method of claim 1 wherein the implanting comprises a first or base ion implant step.

9. The method of claim 8 further comprising a second ion implantation step after the first or base ion implant step.

10. The method of claim 1 wherein said annealing is performed at a temperature of from about 700° to about 1400° C. in an oxidizing ambient.

11. The method of claim 10 wherein the oxidizing ambient includes an oxygen-containing gas that may optionally be diluted with an inert gas.

12. The method of claim 1 wherein said implanting and annealing further includes the steps of depositing a barrier layer over said epitaxially grown semiconductor material and said top semiconductor layer after the implanting and removing said barrier layer after the annealing.

13. The method of claim 12 wherein said barrier layer comprises one or more layers of materials selected from the group consisting of $SiO_2$, $SiN_x$, and silicon.

14. The method of claim 12 wherein said barrier layer has a thickness in the range of 30 to 300 nm.

15. The method of claim 6 wherein said planarizing includes at least one etching step in which oxides formed during the annealing are selectively removed.

16. The method of claim 1 further comprising forming at least one pFET and a least one nFET on said top semiconductor layer and said epitaxially grown semiconductor layer.

17. The method of claim 16 wherein the at least one pFET is located on a (110) crystallographic surface, while the at least one nFET is located on a (100) crystallographic surface.

18. The method of claim 1 wherein the top semiconductor layer has a (110) surface orientation and the semiconductor material has a (100) surface orientation.

19. The method of claim 18 further comprising forming at least one pFET on the (110) surface and at least one nFET the (100) surface.

20. A method of forming an integrated semiconductor structure comprising the steps of:
providing a substrate comprising a base semiconductor substrate layer having a first crystallographic orientation, the base semiconductor substrate layer separated by a first insulating layer from a top semiconductor layer of a second crystallographic orientation, said first crystallographic orientation being different from said second crystallographic orientation;
forming at least one opening in the substrate that exposes a surface of the base semiconductor substrate layer;
filling said at least one opening with an epitaxially grown semiconductor material on said exposed surface of the base semiconductor substrate layer, said epitaxially grown semiconductor material having a crystallographic orientation that is the same as the first crystallographic orientation;
implanting and annealing to (i) form a second insulating layer in the epitaxially grown semiconductor material, and (ii) thicken said first insulating layer underlying the top semiconductor layer; and
planarizing the implanted and annealed semiconductor materials to provide a structure in which the remaining epitaxially grown semiconductor material having the first crystallographic orientation is substantially coplanar and of substantially the same thickness as that of the top semiconductor layer.

21. The method of claim 20 wherein the base semiconductor substrate layer is disposed on a bulk semiconductor substrate.

22. The method of claim 20 wherein the base semiconductor substrate layer is disposed on an auxiliary buried insulator layer, and said implanting and annealing is utilized to extend said auxiliary buried insulator upwards (i) into the epitaxially grown semiconductor material, and (ii) up to the first insulating layer underlying the top semiconductor layer.

23. The method of claim 20 wherein said first insulating layer separating the base semiconductor substrate layer and the top semiconductor layer is omitted, leaving the base and top semiconductors in direct contact at a semiconductor-to-semiconductor interface, and said implanting and annealing is utilized to produce a buried insulator whose top surface is at or above said semiconductor-to-semiconductor interface.

24. The method of claim 20 wherein the base semiconductor substrate layer is disposed on an auxiliary buried insulator layer, said first insulating layer separating the base semiconductor substrate layer and the top semiconductor layer is omitted, leaving the base and top semiconductor layers in direct contact at a semiconductor-to-semiconductor interface, and said implanting and annealing is utilized to extend said auxiliary buried insulator upwards (i) into the epitaxially grown semiconductor material, and (ii) at least up to said semiconductor-to-semiconductor interface.

25. The method of claim 20 wherein the implanting comprises implanting oxygen or nitrogen ions.

26. The method of claim 20 wherein the implanting comprises a first or base ion implant step.

27. The method of claim 26 further comprising a second ion implantation step after the first or base ion implant step.

28. The method of claim 20 wherein said annealing is performed at a temperature of from about 700° to about 1400° C. in an oxidizing ambient.

29. The method of claim 28 wherein the oxidizing ambient includes an oxygen-containing gas that may optionally be diluted with an inert gas.

30. The method of claim 20 wherein said implanting and annealing further includes the steps of depositing a barrier layer over said epitaxially grown semiconductor material and said top semiconductor layer after the implanting and removing said barrier layer after the annealing.

31. The method of claim 30 wherein said barrier layer comprises one or more layers of materials selected from the group consisting of $SiO_2$, $SiN_x$, and silicon.

32. The method of claim 30 wherein said barrier layer has a thickness in the range of 30 to 300 nm.

33. The method of claim 20 wherein said planarizing includes at least one etching step in which oxides formed during the annealing is selectively removed.

34. The method of claim 20 further comprising forming at least one pFET and a least one nFET on said top semiconductor layer and said epitaxially grown semiconductor layer.

35. The method of claim 34 wherein the at least one pFET is located on a (110) crystallographic surface, while the at least one nFET is located on a (100) crystallographic surface.

36. The method of claim 20 wherein the top semiconductor layer has a (110) surface orientation and the semiconductor material has a (100) surface orientation.

37. The method of claim 36 further comprising forming at least one pFET on the (110) surface and at least one nFET the (100) surface.

* * * * *